United States Patent
Oswal et al.

(10) Patent No.: US 7,471,222 B2
(45) Date of Patent: Dec. 30, 2008

(54) PROVIDING INPUT SIGNAL THROUGH A SAMPLE AND HOLD CIRCUIT WITH REDUCED DISTORTION

(75) Inventors: Sandeep K Oswal, Bangalore (IN); Visvesvaraya Pentakota, Bangalore (IN); Abhaya Kumar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 194 days.

(21) Appl. No.: 11/560,833

(22) Filed: Nov. 16, 2006

(65) Prior Publication Data

US 2007/0115610 A1 May 24, 2007

Related U.S. Application Data

(60) Provisional application No. 60/738,763, filed on Nov. 21, 2005.

(51) Int. Cl.
*H03M 1/06* (2006.01)

(52) U.S. Cl. ........................... 341/122; 341/155

(58) Field of Classification Search ................. 341/122, 341/172, 155
See application file for complete search history.

(56) References Cited

U.S. PATENT DOCUMENTS

| | | | | |
|---|---|---|---|---|
| 5,144,222 A | * | 9/1992 | Herbert | 323/271 |
| 5,416,403 A | * | 5/1995 | Stephens | 323/222 |
| 5,781,363 A | * | 7/1998 | Rowan et al. | 360/78.09 |
| 7,095,356 B1 | * | 8/2006 | Pentakota et al. | 341/172 |

* cited by examiner

*Primary Examiner*—Peguy JeanPierre
(74) *Attorney, Agent, or Firm*—Warren J. Franz; Frederick J. Telecky, Jr.; Wade J. Brady, III

(57) ABSTRACT

According to an aspect of the present invention, samples of an input signal are provided with reduced distortion, when the input signal is received from a lead terminal offering lead inductance on an input path. Such a feature is achieved by charging a energy storage element to a value proportional to the input signal using a portion of charging energy received through a path having less lead inductance compared to the path connecting the input signal to the energy storage element. Thus, the energy drawn through the lead impedance is reduced, thereby reducing the magnitude of the distortion caused.

13 Claims, 5 Drawing Sheets

US 7,471,222 B2

PROVIDING INPUT SIGNAL THROUGH A SAMPLE AND HOLD CIRCUIT WITH REDUCED DISTORTION

RELATED APPLICATIONS

The present application claims priority from U.S. provisional patent application entitled, "Input Sampling Circuit for Switched Capacitor Circuits", Ser. No.: 60/738,763 filed on Nov. 21, 2005, naming as inventors Oswal et al, and is incorporated in its entirety herewith.

BACKGROUND

1. Field

The present disclosure relates generally to the field of design of electronic circuits, and more specifically to a method and apparatus for providing input signal through a sample and hold circuit with reduced distortion.

2. Related Art

Sample and hold circuits are often used to sample a continuous signal at a specific time point and hold on the output terminals at least for some duration for further processing. For example, the sampled values may be provided to an Analog to Digital Converter (ADC) for generating a digital code representing the sampled input signal.

It is generally required that a sample and hold circuit provide the input signal for further processing without distortion, i.e., the strength of the input signal at the sampled instance be accurately reflected in the sample provided for further processing.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

According to an aspect of the present invention, samples of an input signal are provided with reduced distortion for further processing. Such a feature is achieved by charging a energy storage element to a value proportional to the input signal using a portion of charging energy received through a path having less lead inductance compared to the path connecting the input signal to the energy storage element. Thus, the energy drawn through the lead impedance is reduced, thereby reducing the magnitude of the distortion caused.

Another aspect of the present invention reduces the distortion by providing an energy storage device (e.g. a capacitor) which supplies a part of the energy to the sampling circuit, thereby reducing the total energy drawn through the input path in a sampling phase.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Environment

Figure 1:
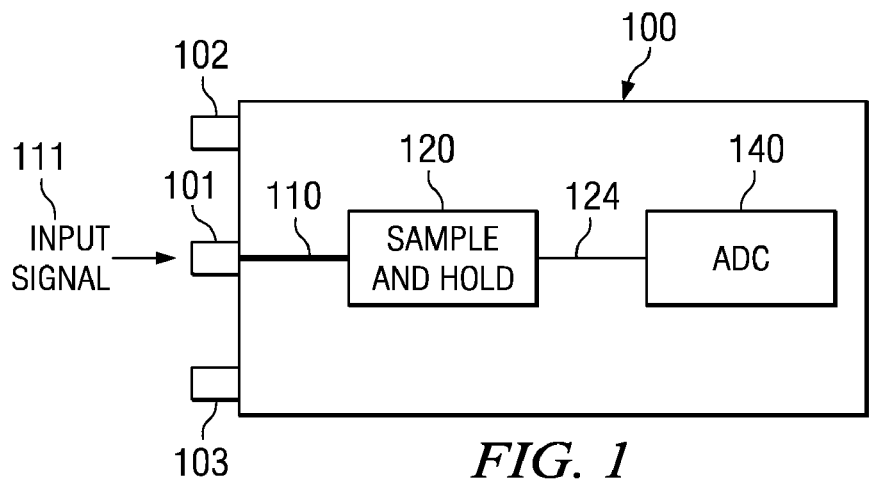
FIG. 1 is a block diagram illustrating the details of an example integrated circuit in an embodiment of the present invention.

FIG. 1 is a block diagram illustrating the details of an example integrated circuit 100 in which various aspects of the present invention are implemented. Integrated circuit 100 is shown containing leads 101-103, path 110, sample and hold circuit 120 and analog to digital converter (ADC) 140. Each block is described below in further detail.

Analog to digital converter (ADC) 140 receives sampled values of input signal 111 on path 124 and generates corresponding digital codes representing the received sample value. The sampled values may be received at a regular time interval determined by a clock signal (not shown). The digital code may be stored in a memory and/or provided to a digital processor (not shown) for further processing.

Leads 101-103 provide a input /output interface for receiving/sending various signals to integrated circuit 100. Leads 101-103 may be provided in various forms such as array pins, ball grids, etc., depending on the package type. In particular, lead 101 is shown receiving an analog input signal 111 desired to be sampled. The strength of the analog input signal 111 may be represented in terms of current or voltage.

Path 110 represents a conductive path (including components such as bond wire) provided from the lead 101 to the location on the silicon on which the sample and hold circuits are fabricated. An input path (for input signal 111) containing lead 101 and path 110 together offers an impedance to the input signal 111. The impedance may be of inductive type or a capacitive type.

Sample and hold circuit 120 samples the strength of analog input signal 111 and provide the sampled values on path 124 with reduced distortion according to various aspects of the present invention. The manner in which the distortion is reduced in an embodiment may be understood by appreciating the source of distortion in a prior sample and hold circuit. Accordingly, such a prior sample and hold circuit is described first.

3. Prior Sample and Hold Circuit

Figure 2:
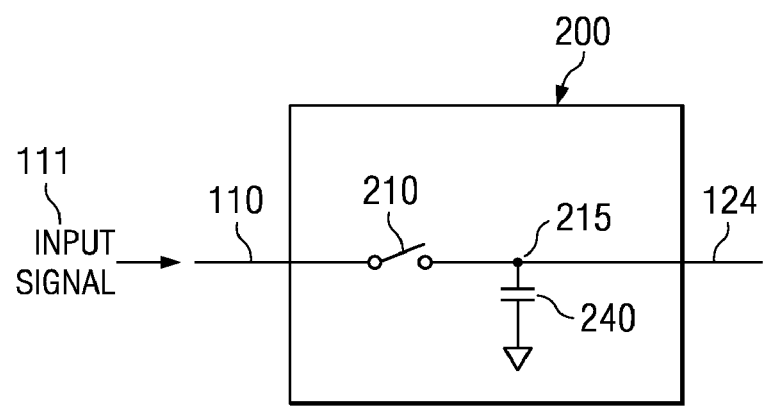
FIG. 2 is a circuit diagram illustrating the operation of a sample and hold circuit in a prior embodiment.

FIG. 2 is a circuit diagram illustrating the sample and hold circuit in a prior embodiment. The circuit diagram is shown containing switch 210 and sampling capacitor 240. Sampling capacitor 240 is shown receiving input signal 111, which would be received via lead 101.

Figure 3A:
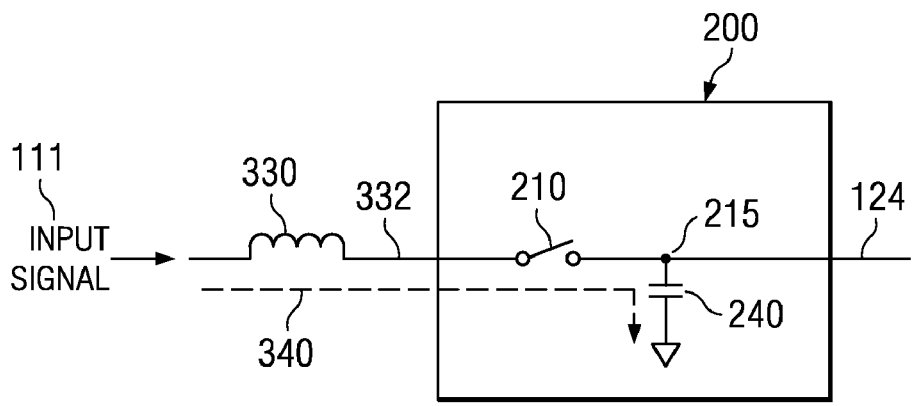
FIG. 3A is a circuit diagram illustrating the cause of distortion in the embodiment of FIG. 2.

The input path of lead 101 and path 110 would have a lead impedance (inductance, in the description below), which can be logically represented by inductor 330, as shown in FIG. 3A. The remaining components of FIG. 2 are retained in FIG. 3A for ease of understanding and explanation.

The operation and effect of each component of FIGS. 2 and 3A is described below with reference to the graphs of FIG. 3B. As may be readily observed, the graphs depict clock signal 360, analog input signal 370, capacitor voltage 380 (signal on node 215), and sampled values 390 (provided to ADC 140 during the hold phases with dots representing level not used by ADC in the sample phase).

Analog input signal 370 is shown having 0 voltage (logic 0) prior to time point 361 and then being at Vin (logic 1) thereafter. Though the signal is shown as having only two discrete levels for ease of understanding, the signal can vary continuously in time domain and the concepts described below are applicable in such a scenario as well.

Switch 210 is closed (one state) when clock signal 360 is at (or transitions to) logic low (logic 0) representing a sample phase, thereby connecting path 332 to one of the terminal (node 215) of the capacitor 240. Switch 210 is opened when the clock signal 360 is at logic high (other state) representing a hold phase. Hence node 215 is disconnected from the path 332 in the hold phase.

When switch 210 is closed at time point 361 (beginning of the sample phase), capacitor 240 draws a large changing current through inductor 330 (as shown by arrow 340). Capacitor 240 draws such large current to charge from one value (V1) to another value (V2).

Such a large current causes a series resonance with inductor 330 and generates the damping oscillation as shown between time points 361 and 362. This damping oscillation is introduced at node 215. The magnitude of the oscillating signal is proportional to the current drawn through the inductor 330.

Figure 3B:
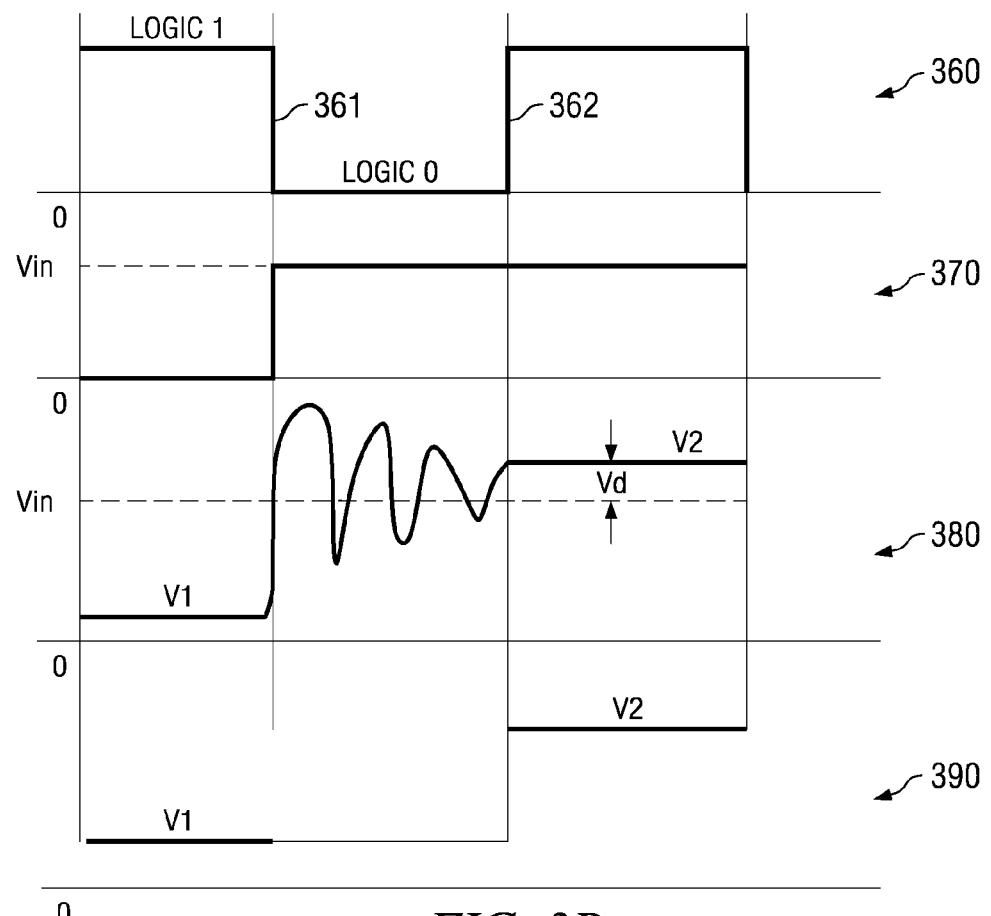
FIG. 3B is a graph illustrating the effect of lead inductance in sampling the input signal in one embodiment.

The oscillation caused may not die down before time point 362 (rising edge of the clock signal), though shown as being damped in FIG. 3B. As a result, capacitor 240 may end up sampling the distorted strength/value caused due to the oscillation. Accordingly, a distorted sample value V2 is provide to ADC 140.

The distortion may limit the SFDR (spurious free dynamic range) performance in a switched capacitor ADCs. The distortion Vd may be significant in high speed sampling since the sampling window could be correspondingly low. In addition, error Vd may be of particular concern in high resolution ADCs since the quantization level corresponding to each step may be low.

A sampling circuit provided according to various aspects of the present invention overcomes at least some of such disadvantages as described below.

4. Invention

Figure 4:
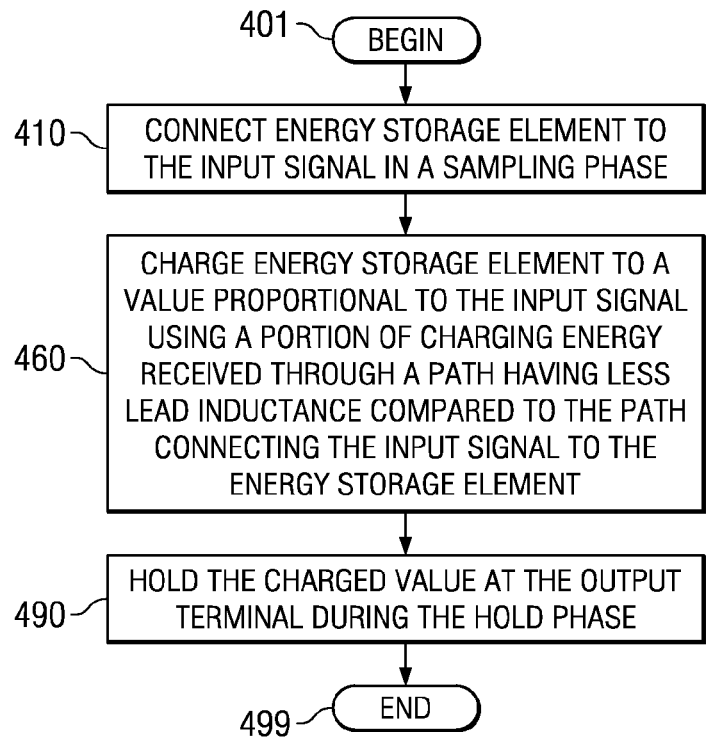
FIG. 4 is a flowchart illustrating the manner in which sample values of an input signal is provided with reduced distortion in an embodiment of the present invention.

FIG. 4 is a flowchart illustrating the manner in which a sample value of an input signal is provided with reduced distortion. The flow chart is illustrated with reference to FIGS. 1 and 3 merely for illustration. However, the features can be implemented in various other embodiments/environments as will be apparent to one skilled in the relevant arts by reading the disclosure provided herein. The flowchart begins in step 401 and control passes to step 410.

In step 410, an energy storage element is connected to the input signal in a sampling phase. The input signal 111 is connected to the energy storage element through path 110. The path 110 may exhibit impedance such as inductance as described with reference to FIG. 3. The energy storage element may be of capacitor (240) type in case of sampling a voltage signal and inductor type in case of sampling a current signal.

In step 460, the energy storage element charges to a value proportional to the input signal using a portion of charging energy received through a path having less lead inductance compared to the path connecting the input signal to the energy storage element. As a result, the energy drawn through the lead impedance is reduced, thereby reducing the magnitude of the distortion caused. The portion of energy may be received at the initial charging stage to support the initial requirements.

For example, in case of the prior embodiment described above with reference to FIG. 3, the entire charging current (charging energy) 340 is drawn through the lead inductance 330. As a result a large magnitude of the current is drawn at the initial stage (due to capacitor charging characteristic) causing a large amplitude of oscillation. Such a phenomenon may be reduced by providing an additional (initial) charging current through a different path having no lead inductance or lesser lead inductance as described below with reference to the example of FIG. 5.

In step 490, the energy storage element holds the charged value at the output terminal during the hold phase. The charged value represents the sampled value of the input signal at the end of sampling phase (rising edge 362 of the clock signal 360). The flowchart ends in step 499. The flowchart can be repeated for each desired sample value.

The manner in which additional charging energy of step 460 is provided in one embodiment of the present invention is described below.

5. Example Sample and Hold Circuit of the Present Invention

Figure 5A:
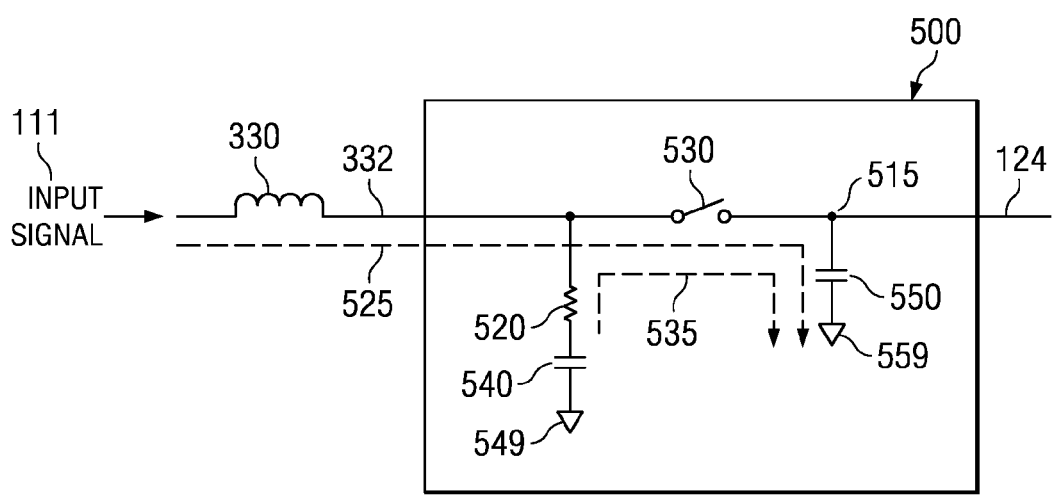
FIG. 5A is a circuit diagram illustrating the manner in which the portion of charging energy is provided according to an aspect of the present invention.

FIG. 5A is a circuit diagram illustrating the manner in which an input signal 111 can be provided with reduced distortion according to an aspect of the present invention. The circuit diagram is shown containing lead inductor 330 (described above), and sample and hold circuit 500. Sample and hold circuit 500 in turn is shown containing switch 530, resistor 520, and capacitors 540 and 550. Each component is described below in further detail.

Capacitor 540 and resistor 520 are shown connected in series. The series combination is shown connected between path 332 and node 549. Switch 530 is shown located between path 332 and node 515. Capacitor (sampling capacitor) 550 is shown connected between nodes 515 and 559. In case of single ended system, nodes 549 and 559 represent a fixed bias or a ground terminal. On the other hand, in a differential (double ended) signal sampling system, the nodes represent differential input signal terminal.

Figure 5B:
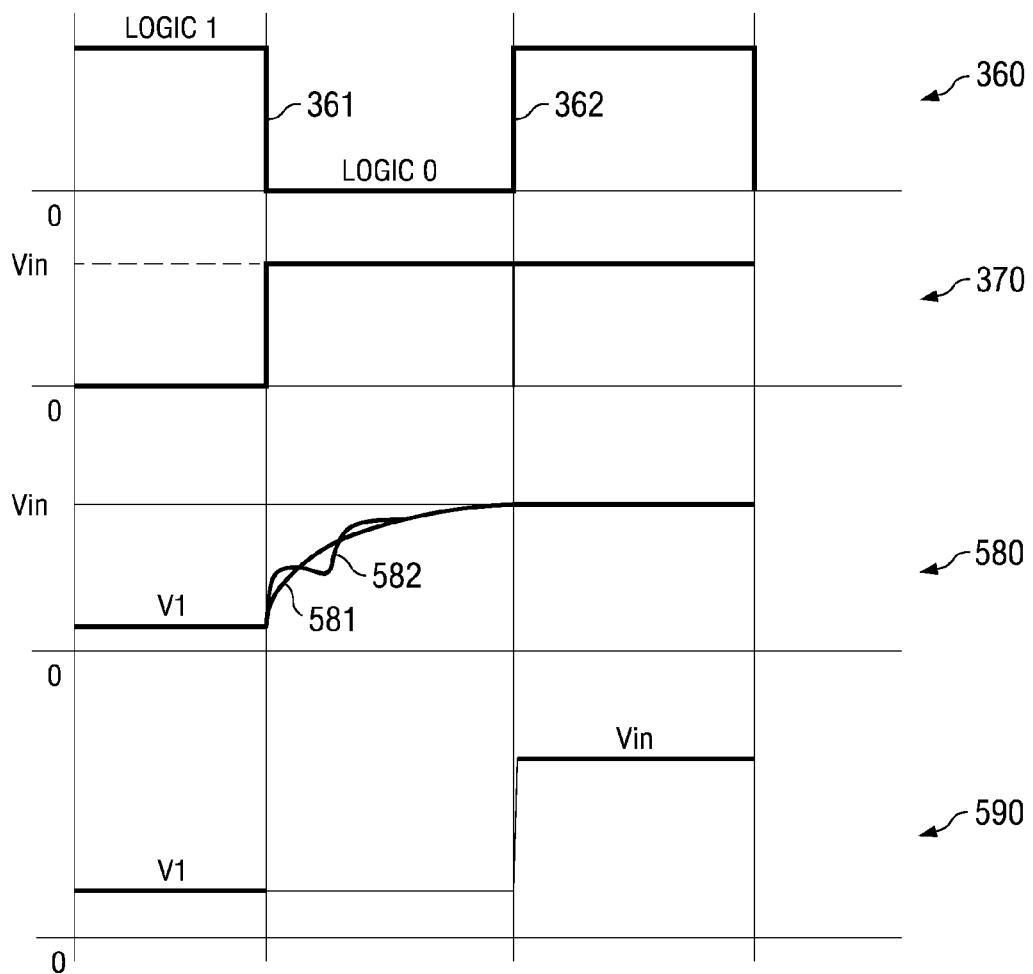
FIG. 5B represents graphs illustrating the sample and hold phase operation in an embodiment of the present invention.

The operation of sample and hold circuit 500 is described with reference to graphs depicted in FIG. 5B. Shown there are the curve 580 representing capacitor voltage (at node 515) and curve 590 representing the sampled values provided to ADC 140 in hold phase (with dots representing level not used by ADC in the sample phase). Curves 580 and 590 are provided with reference to clock signal 360 and analog input signal 370 illustrated with reference to FIG. 3A merely for comparison.

In hold phase, capacitor 550 holds the previous sampled value (V1) on node 515 as shown by curve 580 before fall edge 361 of the clock signal 360. Capacitor 540 charges to a value (not depicted in Figure) corresponding to the strength of the input signal 111 at the end of hold phase (fall edge 361).

In sample phase, switch 530 is closed, thereby connecting the path 332 to node 515. As a result, capacitor 550 receives charging currents 525 and 535 (energy) respectively from input signal 111 and capacitor 540. Thus, a portion of charging current is avoided from flowing through the lead inductance 330.

Graph 580 illustrate the charging of capacitor 550 during the sample phase due to currents 535 and 525. Curve 581 represents the voltage at node 515 due to the charging of capacitor 550 alone by current 535. Since no (or negligible) inductance is present in the path of current 535, the voltage rise is shown with no oscillation. However, curve 582 representing the voltage at node 515 due to the joint operation of input signal 111 and capacitor 540 is shown having oscillation representing the effect of current 525 flowing through inductor 330.

It may be appreciated that current (energy) flowing through inductor 330 is reduced by a magnitude represented by current 535. Accordingly the magnitude of the oscillation is reduced proportionate to the current 535.

The magnitudes of capacitor 540 and resistor 520 may be selected suitably to provide a desired amount of (initial) charging current required and frequency of the sampling clock signal. Alternatively, the series combination of resistor 520 and capacitor 540 connected between path 332 and node 549 operate as a RC filter and hence reduce the oscillations.

Accordingly based on the sampling frequency (frequency of the clock signal), R and C values may be selected to provide effective filtering of the oscillations. The description is continued with respect to the manner in which the above-described features can be extended to differential implementations as well.

6. Differential Implementation

Figure 6:
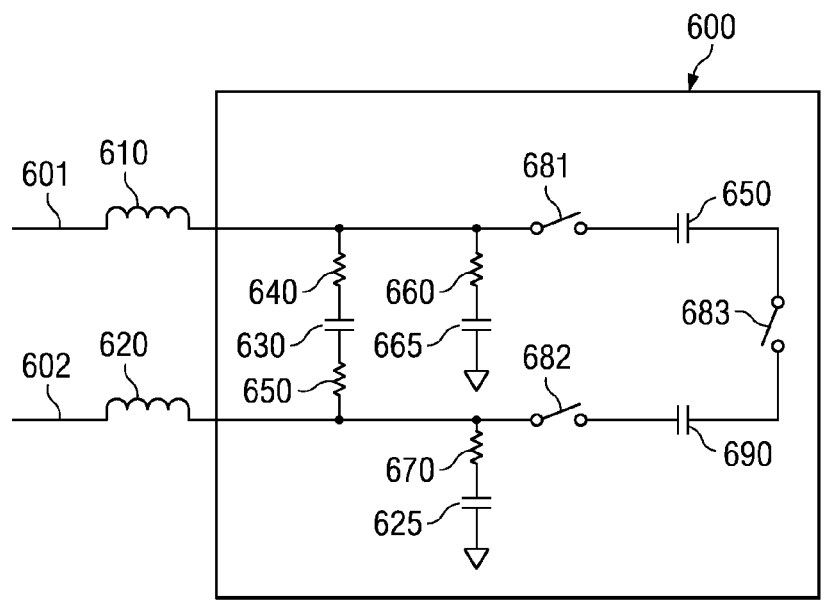
FIG. 6 is a block diagram illustrating the differential implementation of a sample and hold circuit in one embodiment.

FIG. 6 is a circuit diagram illustrating the sample and hold circuit for sampling a differential input signal according to an aspect of the present invention. The circuit is shown containing lead inductors 610 and 620, sampling capacitors 650 and 690, capacitors 675, 630, and 665, switches 681-683 and resistors 640, 650, 660 and 670. Each component is described below in further detail.

Inductors 610 and 620 represents the two lead inductors on the differential input paths 601 and 602. Switches 581 and 582 operate similar to switch 530 described above. Sampling capacitors 650 and 690 are respectively connected to the differential input path 601 and 602 through inductor 610 and 620 in a sample phase. Switches 681 and 682 are opened in hold phase thereby disconnecting the sampling capacitors from the respective input paths. Switch 683 is closed in the hold phase to enable the charge redistribution during the hold phase.

Capacitor 630 is connected in series between resistors 640 and 650. The series combination is connected between two deferential input paths 601 and 602. Capacitor 630 along with resistors 640 and 650 operate similar to capacitor 540 to provide an additional differential (initial) charging current to sampling capacitors 650 and 690. The Resistor and capacitor combinations (660, 665) and (670, 675) connected to the each of the differential input paths provide a common mode charging current.

Though the features are described above with respect to lead inductance and sampling of voltage input signal, it should be appreciated that the features can be extended to lead capacitance and sampling of current input signal, as will be apparent to one skilled in the relevant arts by reading the disclosure provided herein. Such implementations are also contemplated to be covered by at least some aspects of the present invention.

The sample and hold circuit described above may be integrated within ADC 140 and operated as single unit. The sample and hold circuits provided according to various aspects of the present invention may be incorporated in a system as described next with an example

7. Example System

Figure 7:
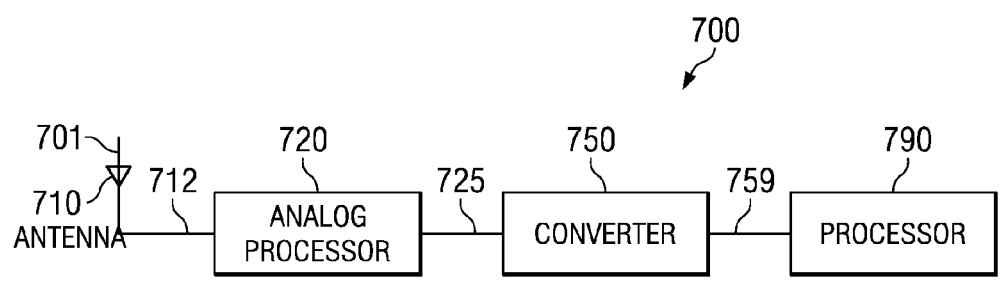
FIG. 7 is a block diagram illustrating the details of an example device in which several features of the present invention can be implemented.

FIG. 7 is a block diagram of an example system incorporating various aspects of the present invention. System 700 is shown containing antenna 710, analog processor 720, converter 750, and processor (processing unit) 790. Each component is described below in further detail.

Antenna 710 may receive an analog signal on path 710 and provide an output on path 712 to analog processor 720. Analog processor 720 may perform front-end analog processing operations such as filtering, down conversion etc., on the signal and provide an output to ADC 750 on path 725. Path 725 may contain the lead inductance described above.

Converter 750 (containing both sample and hold circuit and ADC) generates the sample values of the received signal on path 725 according to various aspects of the present invention described above and performs analog to digital-to-conversion of the sample values. The digital signal is provided on path 759 to processor 790 for further processing. Antenna 710, analog processor 720 and processor 790 may be implemented using known techniques.

ADC 750 may correspond to IC 100 shown in FIG. 1, and may provide digital data on path 759 in single-ended, differential or pseudo-differential form as described above. ADC 750 may be configured in indicate the specific form in which processor 790 is designed to receive digital output, and the digital values provided in the corresponding form as described in the above sections.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An integrated circuit comprising:
   an input path connected from a lead terminal having a lead impedance, said lead impedance being one of an inductance type or a capacitance type, and input signal being provided on said input path;
   a first energy storage component to store energy representing strength of said input signal in a first duration when said input path is communicatively coupled to said first energy storage component, wherein said first energy storage component is the other of said inductance type or said capacitance type;

a switch provided between said input path and said first energy storage component, wherein said switch communicatively couples said input path to said first energy storage component in one state and disconnects said input path from said first energy storage component in another state; and a second energy storage component supplying additional energy to said first energy storage component immediately after said switch is placed in said one state.

2. The integrated circuit of claim 1, wherein each of said first energy storage component and said second energy storage component is of said capacitance type, said lead impedance is of said inductance type and wherein said strength is a voltage level of said input signal.

3. The integrated circuit of claim 2, wherein said second energy storage element is provided coupled to said input path before said switch.

4. The integrated circuit of claim 3, wherein said second energy storage component is connected in series with a resistor, wherein the series combination of said second energy storage component and said resistor is provided between a first node connected to said switch.

5. The integrated circuit of claim 4, wherein a time constant of said series combination is designed to be less than a time constant of said first energy storage component.

6. The integrated circuit of claim 1, further comprising an analog to digital converter (ADC), wherein said ADC generates a digital code from said energy stored in said first energy storage component, whereby said digital code represents said strength.

7. The integrated circuit of claim 1, wherein each of said first energy storage component and said second energy storage component is of said inductance type, said lead impedance is of said capacitance type and wherein said strength is a current level of said input signal.

8. A method of sampling an input signal provided from an input path from a lead terminal having a lead impedance, said method comprising: connecting a first energy storage component to said input signal in a sampling phase;

charging said first energy storage component to a value proportional to said input signal using an aggregate energy, wherein a portion of said aggregate energy is received through a path having less inductance compared to said lead impedance of said input path and another portion of said aggregate energy is provided by said input signal from said input path; and disconnecting said first energy storage component from said input path in a hold phase.

9. The method of claim 8, wherein said portion of charging energy is supplied by a second energy storage component.

10. The method of claim 9, wherein each of said first energy storage element and said second storage element comprises a capacitor.

11. A device comprising:

an input path connected from a lead terminal having a lead impedance, said lead impedance being one of an inductance type or a capacitance type, and input signal being provided on said input path;

a first energy storage component to store energy representing strength of said input signal in a first duration when said input path is communicatively coupled to said first energy storage component, wherein said first energy storage component is the other of said inductance type or said capacitance type;

a switch provided between said input path and said first energy storage component, wherein said switch communicatively couples said input path to said first energy storage component in one state and disconnects said input path from said first energy storage component in another state; and a second energy storage component supplying additional energy to said first energy storage component immediately after said switch is placed in said one state;

an analog to digital converter (ADC), wherein said ADC generates a digital code from said energy stored in said first energy storage component, whereby said digital code represents said strength; and a processor processing said digital code.

12. The device of claim 11, further comprising an analog processor receiving an analog signal and processing said analog signal to provide said input signal on said lead terminal.

13. The device of claim 12, further comprising an antenna receiving said analog signal and providing said analog signal to said analog processor.

* * * * *